United States Patent
Huang et al.

(10) Patent No.: US 7,166,995 B2
(45) Date of Patent: Jan. 23, 2007

(54) DIGITAL POWER METER APPARATUS AND METHOD FOR THE SAME

(75) Inventors: Yi-Chou Huang, Taipei (TW); Kou-Yuan Yuan, Taipei (TW); Arthur Shaoyan Rong, Taipei (TW)

(73) Assignee: Fortune Semiconductor Corp., Taipei (TW)

( * ) Notice: Subject to any disclaimer, the term of this patent is extended or adjusted under 35 U.S.C. 154(b) by 198 days.

(21) Appl. No.: 10/995,496

(22) Filed: Nov. 24, 2004

(65) Prior Publication Data

US 2006/0108996 A1     May 25, 2006

(51) Int. Cl.
*G01R 11/32* (2006.01)

(52) U.S. Cl. ...................................... 324/142

(58) Field of Classification Search ................ 324/142, 324/140–141, 127, 107, 130, 158.1, 765; 702/61, 60; 340/870.11, 870.12, 870.13, 340/870.16, 870.17, 870.18
See application file for complete search history.

(56) References Cited

U.S. PATENT DOCUMENTS

| 5,745,323 | A |   | 4/1998 | English et al. |
| 5,760,619 | A |   | 6/1998 | Yamaguchi |
| 5,764,523 | A | * | 6/1998 | Yoshinaga et al. ............ 702/61 |
| 5,862,069 | A |   | 1/1999 | Nestler |
| 5,872,469 | A |   | 2/1999 | Nestler |
| 6,377,037 | B1 | * | 4/2002 | Burns et al. ................. 324/142 |

FOREIGN PATENT DOCUMENTS

TW    482901    4/2002

* cited by examiner

*Primary Examiner*—Ha Tran Nguyen
*Assistant Examiner*—Tung X. Nguyen

(57) ABSTRACT

A digital power meter apparatus and the method for the same are proposed. The input voltage signal and input current signal through dual channels are processed at a first stage to obtained a first digital signal. The first digital signal is sent to a third low-pass filter. The input voltage signal and input current signal are processed in a second-stage processing through a first low-pass filter, a second low-pass filter and a second logic operation unit to obtain a second digital signal. A third logic operation unit processes the first digital signal and a second digital signal in order to obtain a digital power signal proportion to the product of the two input signals.

9 Claims, 2 Drawing Sheets

DIGITAL POWER METER APPARATUS AND METHOD FOR THE SAME

BACKGROUND OF THE INVENTION

1. Field of the Invention

The present invention relates to a digital power meter apparatus and method for the same, more particularly to a digital power meter apparatus using multipliers and adders arranged in a plurality of stages and method for the same.

2. Description of Prior Art

To calculate the watt consumption for a household user, the prior art electrical power meter generally uses an inductive-type AC ampere meter to calculate the used current. However, the prior art electrical power meter uses mechanical wheel driven by gear to count the ampere used, the electrical power meter using mechanical wheel has problem of erroneous measurement due to manufacture tolerance and teeth ratio variation. Moreover, the prior art electrical power meter is sensible to temperature variation, which causes problem for users distribute at wide area and reduce lifetime of this power meter. This correct watt measurement causes inconvenience both to client and power company.

The electrical power meter has a trend of digitalization as the progress of electrical industry and digital technology. For example, Taiwan patent gazette No. 482901 discloses a digital AC power meter. The disclosed digital AC power meter uses optical signal for outputting digital measurement and sends output through network. However, this digital AC power meter still uses mechanic wheel to count the used current. The precision thereof is still an issue.

Moreover, U.S. Pat. Nos. 5,862,069, 5,745,323, 5,872,469 and 5,760,619 had disclosed related art. More particularly, the U.S. Pat. No. 5,862,069 discloses a power meter and related method using four quadrant, multiplied signal. In this power meter, a first input signal from a dual input channel is processed by a low-pass filter and an interpolator for producing an output signal. The output signal is then multiplied with a second input signal by a multiplier to produce a digital power signal. Moreover, the digital power signal is processed by a low-pass filter to produce an output digital power signal, which accounts for power consumption. The power meter disclosed in this patent has more precise measurement result than the prior art inductive type power meter.

However, the above-mentioned power meter performs signal process for only one input signal and the signal process involves only one multiplication process. The above-mentioned power meter has still limited and unsatisfactory precision. If the used electrical power cannot be precisely measured, it is troublesome for both power company and user.

SUMMARY OF THE INVENTION

The present invention is to provide a digital power meter apparatus using multipliers and adders arranged in a plurality of stages to provide enhanced precision and method for the same.

Accordingly, the present invention provides a digital power meter apparatus with enhanced precision. The digital power meter apparatus comprises a first logic operation unit and a third low-pass filter to perform first-stage processing over a first input signal and a second input signal from a dual input channels. In this stage of processing, a first digital signal is generated. The digital power meter apparatus further comprises a second logic operation unit, a first low-pass filter and a second low-pass filter perform second-stage processing over the first input signal and the second input signal from a dual input channels. In this stage of processing, a second digital signal is generated. The digital power meter apparatus further comprises a third logic operation unit to process the first digital signal and a second digital signal in order to obtain a digital power signal proportion to the product of the two input signals.

The above summaries are intended to illustrate exemplary embodiments of the invention, which will be best understood in conjunction with the detailed description to follow, and are not intended to limit the scope of the appended claims.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
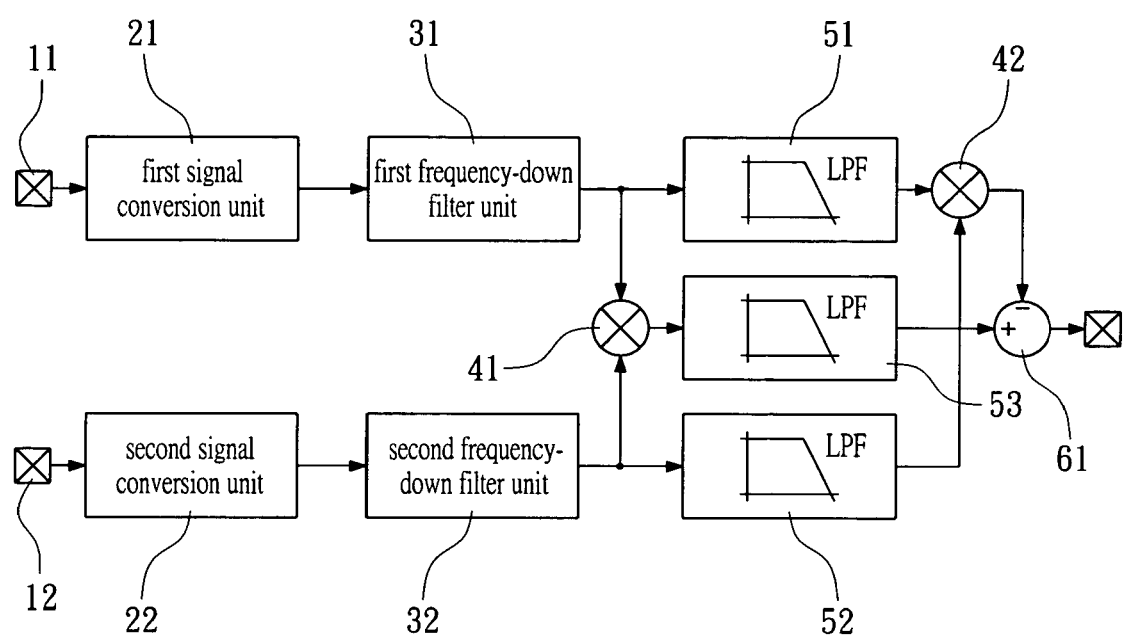
FIG. 1 shows a block diagram of the digital power meter apparatus according to a preferred embodiment of the present invention

FIG. 1 shows a block diagram of the digital power meter apparatus according to a preferred embodiment of the present invention. The digital power meter apparatus according to the present invention comprises a first input channel 11, a second input channel 12, a first signal conversion unit 21, a second signal conversion unit 22 a first frequency-down filter unit 31, a second frequency-down filter unit 32, a first logic operation unit 41, a first low-pass filter 51, a second low-pass filter 52, a third low-pass filter 53 connected to output of the first logic operation unit 41, a second logic operation unit 42 and a third logic operation unit 61.

The first input channel 11 is used to detect an analog time-varying voltage signal for producing a first input signal. The second input channel 12 is used to detect an analog time-varying current signal for producing a second input signal.

The first signal conversion unit 21 and the second signal conversion unit 22 receive the time-varying analog signals from the first input channel 11 and the second input channel 12, respectively and modulate the time-varying analog signals into digital signals. The digital signals output by the first signal conversion unit 21 and the second signal conversion unit 22 are the input signals for the first frequency-down filter unit 31 and the second frequency-down filter unit 32, respectively.

The first signal conversion unit 21 and the second signal conversion unit 22 have the same sampling frequency and the same data transmission rate. In other word, the first signal conversion unit 21 and the second signal conversion unit 22 convert any analog input into 1-bit digital signal. In this situation, the first signal conversion unit 21 and the second signal conversion unit 22 have the same sampling frequency and the same data transmission rate.

The input of the first frequency-down filter unit 31 and the second frequency-down filter unit 32 are connected to the first signal conversion unit 21 and the second signal conversion unit 22, respectively, in order to remove noise. Moreover, the first frequency-down filter unit 31 and the second frequency-down filter unit 32 convert the 1-bit digital input signal into n-bit digital output signal. Moreover, the output of the first frequency-down filter unit 31 is sent to one input end of the first logic operation unit 41 and the input of the first low-pass filter 51. The output of the second frequency-down filter unit 32 is sent to another input end of the first logic operation unit 41 and the input of the second low-pass filter 52.

The first frequency-down filter unit 31 and the second frequency-down filter unit 32 performs a frequency-down operation with a frequency-down factor, which is determined by the ratio of the sampling frequency and the data transmission rate in the input signal. The frequency-down operation is performed by 2's complement logic operation. Therefore, the output data transmission rates of the first frequency-down filter unit 31 and the second frequency-down filter unit 32 are different to the input sampling rates of the first signal conversion unit 21 and the second signal conversion unit 22. Moreover, the first frequency-down filter unit 31 and the second frequency-down filter unit 32 adopt the same frequency-down factor.

In the present invention, the first logic operation unit 41 is a digital multiplier with one input end connected to the output of the first frequency-down filter unit 31, which converts the output of the first signal conversion unit 21. The digital multiplier has another input end connected to the output of the second frequency-down filter unit 32, which converts the output of the second signal conversion unit 22. The first logic operation unit 41 performs multiplication to the two output signals from the first frequency-down filter unit 31 and the second frequency-down filter unit 32 in order to output a digital signal.

The third low-pass filter 53 is connected to the output of the first logic operation unit 41 for receiving the digital signal after multiplication operation. The third low-pass filter 53 processes the digital signal to output a filtered signal as one input signal of the third logic operation unit 61.

The input of the first low-pass filter 51 and the second low-pass filter 52 are connected to corresponding one output of the first frequency-down filter unit 31 and the second frequency-down filter unit 32, respectively. The first low-pass filter 51 and the second low-pass filter 52 generate filtered output to function as two input signal of the second logic operation unit 42.

In the preferred embodiment of the present invention, the first low-pass filter 51 and the second low-pass filter 52 are implemented by infinite impulse response (IIR) low pass units in cascaded connection. The first low-pass filter 51 and the second low-pass filter 52, each contains a plurality of adders to perform adding operation to input signal, forward signal and reverse feedback signal. The adder of the third logic operation unit 61 is preceded by a digital multiplier. The output of the digital multiplier is then sent to the input of the coupled adder.

The first low-pass filter 51, the second low-pass filter 52, and the low-pass filter 53 have the same input sampling frequency and the same data transmission rate. Moreover, the first low-pass filter 51, the second low-pass filter 52, and the third low-pass filter 53 have the same input sampling frequency.

The second logic operation unit 42 is a digital multiplier in the preferred embodiment of the present invention and performs adding operation to the output signal of the first low-pass filter 51 and the second low-pass filter 52 in order to generate a digital signal as another input signal of the third logic operation unit 61.

In the operation of the first logic operation unit 41 and the second logic operation unit 42, the input signals are saved in register and then digital multiplication operation is performed by a shift register and a single adder. Moreover, the first logic operation unit 41 and the second logic operation unit 42 have the same input sampling frequency and the same output transmission data rate.

The third logic operation unit 61 is connected to the output of the third low-pass filter 53, which performs filter processing to multiplication output of the first logic operation unit 41. The third logic operation unit 61 performs a subtraction operation to the output of the third low-pass filter 53 with the output of the second logic operation unit 42 to generate a digital power signal proportion to the product of input time-varying signals.

The third logic operation unit 61 is implemented by serial connected adders with single bit operation to generate sum bit and carry bit for the adding operation of next stage.

Figure 2:
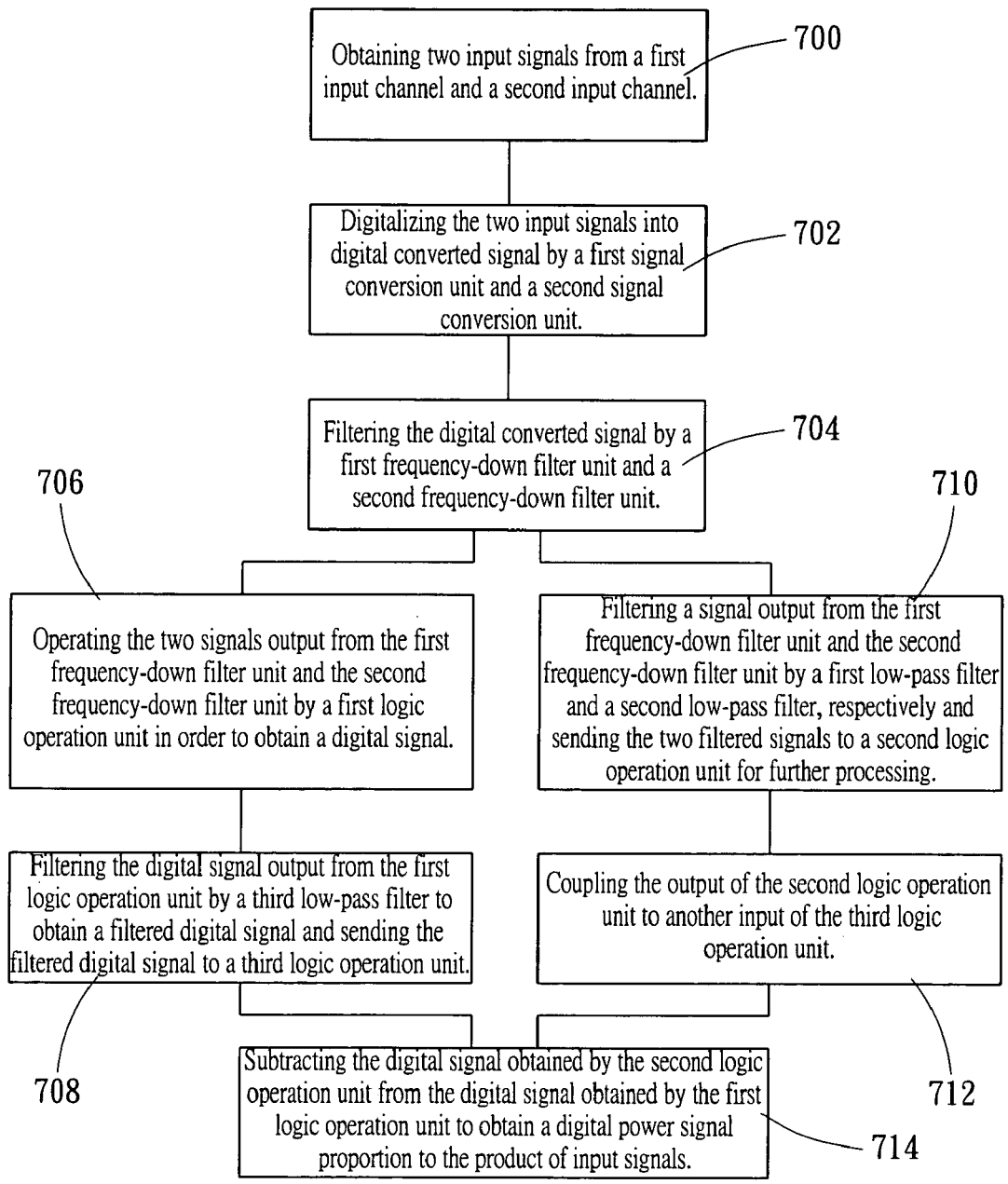
FIG. 2 shows the flowchart of the operational steps for the digital power meter according to the present invention.

FIG. 2 shows the flowchart of the operational steps for the digital power meter according to the present invention, which comprises following steps:

Step 700: Obtaining the first analog input signal and the second analog input signal from the first input channel 11 and the second input channel 12.

Step 702: Digitalizing the first analog input signal and the second analog input signal input from the first input channel 11 and the second input channel 12 into digital converted signal by the first signal conversion unit 21 and the second signal conversion unit 22.

Step 704: Filtering the digital converted signal by the first frequency-down filter unit 31 and the second frequency-down filter unit 32 connected to the output of the first signal conversion unit 21 and the second signal conversion unit 22, respectively.

Step 706: Multiplying the two signals output from a first path of the first frequency-down filter unit 31 and a first path of the second frequency-down filter unit 32 by the first logic operation unit 41 in order to obtain a digital signal.

Step 708: Filtering the digital signal output from the first logic operation unit 41 by the third low-pass filter 53 to obtain a filtered digital signal and sending the filtered digital signal to an input end of the third logic operation unit 61.

Step 710: Filtering a signal output from a second path of the first frequency-down filter unit 31 and a second path of the second frequency-down filter unit 32 by the first low-pass filter 51 and the second low-pass filter 52, respectively and sending the two filtered signals to the second logic operation unit 42 for further processing.

Step 712: Coupling the output of the second logic operation unit 42 to another input of the third logic operation unit 61.

Step 714: Subtracting the digital signal obtained by the second logic operation unit 42 from the digital signal obtained by the first logic operation unit 41 to obtain a digital power signal proportion to the product of input signals.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A digital electrical power meter, comprising
   a first input channel and a second input channel for receiving a first analog input signal and a second analog input signal, respectively;
   a first signal conversion unit and a second signal conversion unit connected to the output of the first input channel and a second input channel and converting the first analog input signal and the second analog input signal into corresponding digital signals;
   a first frequency-down filter unit and a second frequency-down filter unit connected to the first signal conversion unit and the second signal conversion unit, respectively and used to filter the corresponding digital signals;
   a first logic operation unit having two input ends connected to the output of first frequency-down filter and the output of the second frequency-down filter unit;
   a third low-pass filter connected to the output of the first logic operation unit in order to filter the output of the first logic operation unit;
   a first low-pass filter and a second low-pass filter connected to the output of the first frequency-down filter unit and the second frequency-down filter unit, respectively;
   a second logic operation unit processing the output signal from the first low-pass filter and the second low-pass filter; and
   a third logic operation unit performed a subtracting operation between the output from the first logic operation unit and the second logic operation unit to obtain a digital power signal proportion to the product of the first analog input signal and the second analog input signal.

2. The digital electrical power meter as in claim 1, wherein the first analog input signal and the second analog input signal are voltage analog time-varying signal and current analog time-varying signal, respectively.

3. The digital electrical power meter as in claim 1, wherein the first signal conversion unit and the second signal conversion unit have the same sampling frequency and the same data transmission rate.

4. The digital electrical power meter as in claim 1, wherein the first frequency-down filter unit has a frequency-down factor, which is determined by the ratio of the sampling frequency and the data transmission rate in the input analog signal; the second frequency-down filter unit has a frequency-down factor, which is determined by the ratio of the sampling frequency and the data transmission rate in the input analog signal; the first frequency-down filter unit having the same frequency-down factor as that of the second frequency-down filter unit; the output data transmission rate of the first frequency-down filter unit being different to the input sampling rate of the first signal conversion unit; the output data transmission rate of the second frequency-down filter unit being different to the input sampling rate of the second signal conversion unit; the frequency-down operation of the first frequency-down filter unit and the second frequency-down filter unit being performed by 2's complement logic operation.

5. The digital electrical power meter as in claim 1, wherein the first low-pass filter and the second low-pass filter are implemented by infinite-impulse-response low pass units in cascaded connection, each contains a plurality of adders to perform adding operation to input signal, forward signal and reverse feedback signal; the adders having input coupled to output of a digital multiplier.

6. The digital electrical power meter as in claim 1, wherein the first low-pass filter has the input sampling frequency same as the data transmission rate thereof, the second low-pass filter has the input sampling frequency same as the data transmission rate thereof, the third low-pass filter has the input sampling frequency same as the data transmission rate thereof, the first low-pass filter, the second low-pass filter, and the low-pass filter have the same input sampling frequency.

7. The digital electrical power meter as in claim 1, wherein each of the first logic operation unit and the second logic operation unit has a register for saving input signal, a shift register and a single adder for digital multiplication operation.

8. The digital electrical power meter as in claim 1, wherein the first logic operation unit has the input sampling frequency same as the output data transmission rate thereof, the second logic operation unit has the input sampling frequency same as the output data transmission rate thereof.

9. The digital electrical power meter as in claim 1, wherein the third logic operation unit is implemented by serial connected adders with single bit operation to generate sum bit and carry bit for the adding operation of next stage.

* * * * *